United States Patent
Kim et al.

(10) Patent No.: US 9,875,793 B2
(45) Date of Patent: Jan. 23, 2018

(54) STORAGE AND PROGRAMMING METHOD THEREOF

(71) Applicant: Samsung Electronics Co., Ltd., Suwon-si, Gyeonggi-do (KR)

(72) Inventors: Kyungryun Kim, Seoul (KR); Sangyong Yoon, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 38 days.

(21) Appl. No.: 15/176,964

(22) Filed: Jun. 8, 2016

(65) Prior Publication Data
US 2016/0284397 A1    Sep. 29, 2016

Related U.S. Application Data

(63) Continuation of application No. 14/461,581, filed on Aug. 18, 2014, now Pat. No. 9,378,137.

(30) Foreign Application Priority Data

Oct. 1, 2013    (KR) ........................ 10-2013-0117467

(51) Int. Cl.
*G06F 12/02*  (2006.01)
*G11C 11/56*  (2006.01)
*G11C 16/10*  (2006.01)
*G11C 16/16*  (2006.01)
(Continued)

(52) U.S. Cl.
CPC ...... *G11C 11/5628* (2013.01); *G06F 12/0246* (2013.01); *G11C 11/5642* (2013.01); *G11C 16/10* (2013.01); *G11C 16/16* (2013.01); *G11C 16/30* (2013.01); *G06F 12/10* (2013.01); *G06F 2212/7201* (2013.01)

(58) Field of Classification Search
None
See application file for complete search history.

(56) References Cited

U.S. PATENT DOCUMENTS

| 8,437,188 B2 | 5/2013 | Kajigaya |
| 8,526,246 B2 | 9/2013 | Gupta et al. |
| 2008/0205146 A1 | 8/2008 | Kajigaya |

(Continued)

FOREIGN PATENT DOCUMENTS

| KR | 20090129624 A | 5/1994 |
| KR | 100739946 B1 | 7/2007 |

(Continued)

*Primary Examiner* — Duc Doan
(74) *Attorney, Agent, or Firm* — Harness, Dickey & Pierce, P.L.C.

(57) ABSTRACT

A program method of a storage device which includes at least one nonvolatile memory device and a memory controller to control the at least one nonvolatile memory device, the program method comprising: performing a first normal program operation to store first user data in a memory block; detecting, at the memory controller, a first event; performing a dummy program operation to store dummy data in at least one page of the memory block in response to the detection of the first event; and performing a second normal program operation to store second user data in the memory block after the dummy program operation, dummy program operations being operations in which random data is programmed into the memory block, normal program operations being operations in which data other than random data is programmed in the memory block.

31 Claims, 18 Drawing Sheets

(51) Int. Cl.
*G11C 16/30* (2006.01)
*G06F 12/10* (2016.01)

(56) References Cited

U.S. PATENT DOCUMENTS

| | | |
|---|---|---|
| 2009/0310404 A1 | 12/2009 | Cho et al. |
| 2012/0140582 A1 | 6/2012 | Gupta et al. |
| 2012/0147669 A1 | 6/2012 | Byeon |
| 2012/0246392 A1 | 9/2012 | Cheon |
| 2015/0006939 A1 | 1/2015 | Lim et al. |

FOREIGN PATENT DOCUMENTS

| | | |
|---|---|---|
| KR | 20090129205 A | 12/2009 |
| KR | 20110001102 A | 1/2011 |
| KR | 20120066347 A | 6/2012 |
| KR | 20130034830 A | 4/2013 |
| KR | 2015-0003577 A | 1/2015 |

STORAGE AND PROGRAMMING METHOD THEREOF

CROSS-REFERENCE TO RELATED APPLICATIONS

This application is a continuation of and claims priority under 35 U.S.C. §§ 120/121 to U.S. patent application Ser. No. 14/461,581, filed on Aug. 18, 2014, which claims priority under 35 U.S.C. § 119 to Korean Patent Application No. 10-2013-0117467 filed Oct. 1, 2013, in the Korean Intellectual Property Office, the entire contents of each of which are hereby incorporated by reference.

BACKGROUND

At least some example embodiments of the inventive concepts described herein relate to a storage device and a programming method thereof.

Semiconductor memory devices may be divided into volatile memory devices such as a DRAM, an SRAM, etc. and nonvolatile memory devices such as an EEPROM, a FRAM, a PRAM, an MRAM, a flash memory, etc. The volatile memory devices may lose data stored therein at power-off, but the nonvolatile memory devices may retain data stored therein even at power-off. In particular, the flash memory may be advantageous to high programming speed, low power consumption, mass storage, etc. Thus, a flash memory based data storage device may be widely used. The flash memory based data storage devices may include a solid state drive for replacement of a general hard disk drive, memory cards such as an SD card and an MMC, etc.

SUMMARY

At least some example embodiments of the inventive concepts are directed to provide a program method of a storage device which includes at least one nonvolatile memory device and a memory controller to control the at least one nonvolatile memory device, the program method including performing a first normal program operation to store first user data in a memory block; detecting, at the memory controller, a first event; performing a dummy program operation to store dummy data in at least one page of the memory block in response to the detection of the first event; and performing a second normal program operation to store second user data in the memory block after the dummy program operation, dummy program operations being operations in which random data is programmed into the memory block, normal program operations being operations in which data other than random data is programmed in the memory block.

According to at least some example embodiments of the inventive concepts, each of the first and second normal program operations is a multi-bit program operation.

According to at least some example embodiments of the inventive concepts, the multi-bit program operation is performed in a reprogramming manner.

According to at least some example embodiments of the inventive concepts, the first event is receipt of a request of a host.

According to at least some example embodiments of the inventive concepts, the first event is a sudden power-off, the sudden power-off being an event during which power supplied to the at least one non-volatile memory device ceases.

According to at least some example embodiments of the inventive concepts, the sudden power-off information is obtained from normal power-off information indicating that a power is normally turned off by a host.

According to at least some example embodiments of the inventive concepts, the at least one page is a boundary page which was being programmed when the sudden power-off occurs.

According to at least some example embodiments of the inventive concepts, the performing a dummy program operation comprises searching the boundary page.

According to at least some example embodiments of the inventive concepts, the performing a dummy program operation comprises determining a program depth of at least one lower page below the boundary page; and when the program depth is less than a desired value, performing a dummy program operation on the at least one lower page.

According to at least some example embodiments of the inventive concepts, the first normal program operation is performed in a reprogramming manner, and the performing a dummy program operation further comprises, when the program depth is more than the desired value, completing a reprogram operation on the at least one lower page.

According to at least some example embodiments of the inventive concepts, the performing a dummy program operation comprises determining whether at least one upper page above the boundary page is a clean page, the clean page being a page that is in an erase state; and when the determining indicates that the at least one upper page is not the clean page, performing a dummy program operation on the at least one upper page.

According to at least some example embodiments of the inventive concepts, the program method further comprises performing another dummy program operation on the memory block after the second normal program operation; and after the another dummy program operation, performing a third normal program operation to store third user data.

According to at least some example embodiments of the inventive concepts, the dummy data is random data generated using a seed value.

According to at least some example embodiments of the inventive concepts, the memory block includes a plurality of pages. Each of the plurality of pages includes a main area to store user data and a spare area to store meta information for management of the user data. The spare area stores information indicating whether each of the pages experiences the dummy program operation.

According to at least some example embodiments of the inventive concepts, the performing the dummy program operation includes performing the dummy program operation such that a program speed of the dummy program operation is faster than a program speed of each of the first and second normal program operations.

According to at least some example embodiments of the inventive concepts, the performing the dummy program operation includes performing the dummy program operation such that a pass voltage of the dummy program operation is set to be lower than a pass voltage of the first and second normal program operations such that pass voltage disturbance is reduced.

According to at least some example embodiments of the inventive concepts, the performing the first and second program operations includes performing the first and second program operations such that the first and second user data is programmed in 3-bit memory cells through the first and second normal program operations, and the performing the dummy program operation includes performing the dummy program operation such that the dummy data is programmed in single-level memory cells through the dummy program operation Another aspect of embodiments of the inventive concept is directed to provide a program method of a nonvolatile memory device, the program method comprising searching to identify an initial clean word line of a memory block after a sudden power-off, the sudden power-off being an event during which power supplied to the nonvolatile memory device ceases, a clean word line being a word line that is connected to memory cells that are in the erase state; determining a program depth of a lower word line below the initial clean word line; performing a dummy program operation on memory cells connected to the lower word line, when the program depth is less than a desired value; performing a dummy program operation on memory cells connected to the initial clean word line; and conducting continuous use on memory cells connected to at least one upper word line above the initial clean word line, the continuous use including programming user data into the memory cells connected to the at least one upper word line.

According to at least some example embodiments of the inventive concepts, the searching an initial clean word line of a memory block comprises sequentially performing a clean page read operation on a plurality of pages using a read clean page read voltage; and when the number of memory cells having threshold voltages higher than the clean page read voltage and connected to a particular page is more than a predetermined value, determining the particular page to be a clean page.

According to at least some example embodiments of the inventive concepts, the program method further comprises using an address corresponding to the initial clean word line as a seed value when dummy data to be used for the dummy program operation is generated.

According to at least some example embodiments of the inventive concepts, the searching an initial clean word line of a memory block further comprises searching the initial clean word line using a binary searching manner.

According to at least some example embodiments of the inventive concepts, the program method further comprises checking whether a page associated with at least one upper word line above the initial clean word line is a clean page.

According to at least some example embodiments of the inventive concepts, the program method further comprises as a consequence of determining that the page is not the clean page, performing a dummy program operation on the page.

Still another aspect of embodiments of the inventive concept is directed to provide a program method of a nonvolatile memory device, the program method comprising reprogramming first user data in first multi-level cells of a memory block; programming dummy data in single-level cells of the memory block; and reprogramming second user data in second multi-level cells of the memory block.

According to at least some example embodiments of the inventive concepts, each of the first and second multi-level cells is a 3-level cell.

According to at least some example embodiments of the inventive concepts, the dummy data is programmed when a power is supplied after sudden power-off.

According to at least some example embodiments of the inventive concepts, the programming dummy data in single-level cells of the memory block comprises searching a boundary page of the memory block which was being programmed during the sudden power-off; and programming dummy data in the boundary page.

Still another aspect of embodiments of the inventive concept is directed to provide a storage device comprising at least one nonvolatile memory device including a plurality of memory blocks each having a plurality of pages; and a memory controller configured to control the at least one nonvolatile memory device, wherein the memory controller comprises a dummy program operation determinator configured to search a boundary page according to a request of a host or according to sudden power-off information and to determine whether to perform a dummy program operation on the boundary page; and a dummy data generator configured to generate dummy data when the dummy program operation is performed.

According to at least some example embodiments of the inventive concepts, the dummy program operation determinator checks a program depth of at least one lower page below the boundary page or whether at least one upper page above the boundary page is a clean page. As a consequence of determining that the program depth is less than a predetermined value or that the at least one page is not the clean page, the dummy program operation determinator decides an execution of the dummy program operation on the at least one upper page or the at least one lower page.

According to at least some example embodiments of the inventive concepts, the storage device is an eMMC.

A further aspect of embodiments of the inventive concept is directed to provide a program method of a nonvolatile memory device, the program method comprising programming first user data in at least first one page of a memory block; programming meaningless data in at least one page of the memory block after sudden power-off; and programming second user data in at least second one page of the memory block after the meaningless data is programmed.

According to at least one example embodiment of the inventive concepts. A method of operating a storage device including a nonvolatile memory device and a memory controller for controlling the nonvolatile memory device, the nonvolatile memory device including at least one memory block having a plurality of data pages, the method including performing a first programming operation by programming user data into one or more first data pages from among the plurality of data pages; beginning, after the first programming operation, a second programming operation by programming user data into a second data page from among the plurality of data pages; detecting, at the memory controller, a first event before the programming of data into the second data page is complete; and in response to the detection of the first event, performing a dummy programming operation by programming random data into a boundary data page, the second data page being the boundary data page, and performing, after the dummy programming operation, a third programming operation by programming user data into one or more third data pages from among the plurality of data pages.

BRIEF DESCRIPTION OF THE FIGURES

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION

Figure 1:
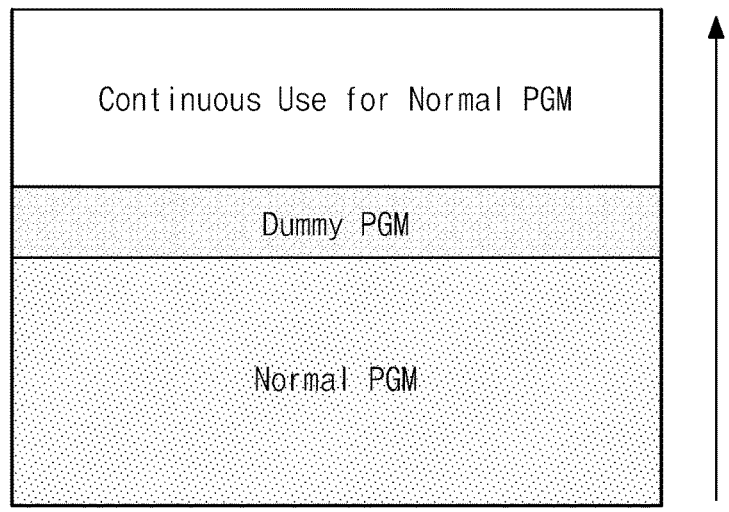
FIG. 1 is a diagram for explaining at least some example embodiments of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", an and the are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A storage device including a nonvolatile memory device according to at least some embodiments of the inventive concepts may support a continuous use (or, referred to as "subsequent write" or "continuous write") in which a memory block is continuously used after performing a dummy program operation.

A nonvolatile memory device according to the inventive concepts may be a NAND flash memory, a vertical NAND flash memory (VNAND), a NOR flash memory, a resistive RAM (RRAM), a phase-change RAM (PRAM), a magnetoresistive RAM (MRAM), an STT-RAM (Spin Transfer Torque Random Access Memory), or the like. Also, the nonvolatile memory device may be implemented to have a three-dimensional array structure. At least some example embodiments of the inventive concepts are applicable to not only a flash memory device where a charge storage layer is formed of a floating gate, but also a charge trap flash (CTF) memory where a charge storage layer is formed of an insulation film. Below, it is assumed that a nonvolatile memory device is a NAND flash memory device.

FIG. 1 is a diagram for facilitating description of at least some example embodiments of the inventive concepts. Referring to FIG. 1, a dummy program operation may be performed in response to a particular event during execution of a normal program operation of a memory block. Continuous use for the normal program operation of the memory block may be made after the dummy program operation. Examples of the particular event include, but are not limited to, a request of a host, sudden power-off SPO of a nonvolatile memory device, or a request according to management (e.g., a controller) of the nonvolatile memory device.

For example, at least some example embodiments of the inventive concepts may be implemented to perform a first normal program operation to store first user data in a memory block, to perform a dummy program operation to store dummy data in at least one page of the memory block, and then to perform a second normal program operation to store second user data in the memory block.

Here, the dummy data may be meaningless data. At least some embodiments of the inventive concepts may be implemented to program first user data in at least a first page of a memory block, to program meaningless data in at least one page of the memory block after sudden power-off SPO, and to program second user data in at least a second page after programming the meaningless data.

When an event is generated during a program operation, a general storage device may use a newly assigned memory block instead of a previously assigned corresponding memory block. The general storage device may store user data in the newly assigned memory block, and may erase a previous memory block. In this case, the number of erase operations may be unnecessarily increased due to generation of particular events.

On the other hand, although a particular event is generated during a program operation, a storage device according to at least some example embodiments of the inventive concepts may not assign a new memory block, and the storage device may continuously use a current memory block after performing a dummy program operation. Thus, according to at least some example embodiments, a program operation of a memory block performed before generation of an event may be used continuously even after the event is ended. A lifetime of the nonvolatile memory device may be extended by reducing the number of unnecessary erase operations through the continuous use.

For ease of description, it may be assumed that a nonvolatile memory device is a NAND flash memory device and that a particular event is sudden power-off SPO.

Figure 2:
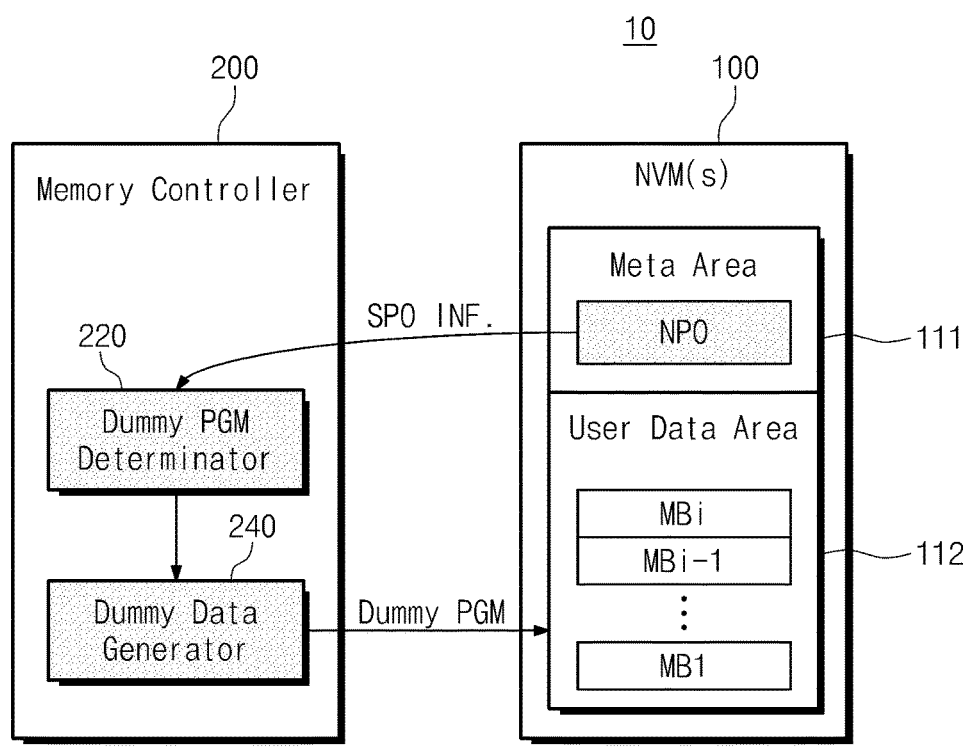
FIG. 2 is a block diagram schematically illustrating a storage device according at least some example embodiments of the inventive concepts.

FIG. 2 is a block diagram schematically illustrating a storage device according to at least some embodiments of the inventive concepts. Referring to FIG. 2, a storage device 10 may include at least one nonvolatile memory device 100 and a memory controller 200 controlling the nonvolatile memory device 100.

The nonvolatile memory device 100 may include a meta area 111 to store management information for management of a nonvolatile memory device and a user data area 112 to store user data. The user data area 112 may include a plurality of memory blocks MB1 to MBi (i being an integer of 2 or more).

The meta area 111 may be formed of at least one memory block having the same structure as that of each of the memory blocks MB1 to MBi in the user data area 112. The meta area 111 may store power information indicating normal power-off NPO. Here, the power information may be stored in a particular location of the meta area 111 in response to a power-off notification issued from a host.

According to at least some example embodiments of the inventive concepts, the nonvolatile memory device 100 may be booted based on the stored power information.

According to at least some example embodiments of the inventive concepts, SPO information may be obtained based on the stored power information. For example, it is assumed that the nonvolatile memory device 100 is powered off. In this case, if the stored power information does not indicate normal power-off NPO, the nonvolatile memory device 100 may be treated to be SPO.

The memory controller 200 may determine whether to perform a dummy program operation based on power information, and may perform a dummy program operation on at least one page of the nonvolatile memory device 100. The memory controller 200 may include a dummy program determinator 220 and a dummy data generator 240.

The dummy program determinator 220 may determine whether the nonvolatile memory device 100 is suddenly powered off, based on power information read from the meta area 111. As a consequence of determining that the nonvolatile memory device 100 is suddenly powered off, the dummy program determinator 220 may search a boundary page that was being programmed at sudden power-off. If the boundary page is searched, the dummy program determinator 220 may determine whether a dummy program operation on the boundary page is required.

According to at least some example embodiments of the inventive concepts, although a boundary page is searched, whether to execute the dummy program operation may be determined according to the number of clean pages. Here, a clean page may mean a page in which data is not written.

The dummy data generator 240 may generate random or, alternatively, pseudorandom, data (or, meaningless data) when a dummy program operation on the boundary page is required. As used herein, the term random data include pseudorandomly generated data. For example, the random data may be generated using an address (e.g., a physical address or a logical address) corresponding to the searched boundary page as a seed value.

When the dummy program operation is decided, the memory controller 200 may issue a program command, an address corresponding to the boundary page, and dummy data to the nonvolatile memory device 100.

In some conventional devices, a memory block where a program operation is executed at sudden power-off may not be used. Instead, a new memory block may be assigned, and a previous program operation may be performed. With this scheme, although a memory block has many clean pages, it may be erased, so a lifetime of a memory block may be shortened.

On the other hand, the storage device 10 according to at least some embodiments of the inventive concepts may make continuous use of clean pages existing in a memory block by searching a boundary page of the memory block at sudden power-off and performing a dummy program operation on the boundary page. Thus, odd data programmed in the memory block may be secure, and a lifetime of the memory block may be improved by preventing an unnecessary erase operation.

Figure 3:
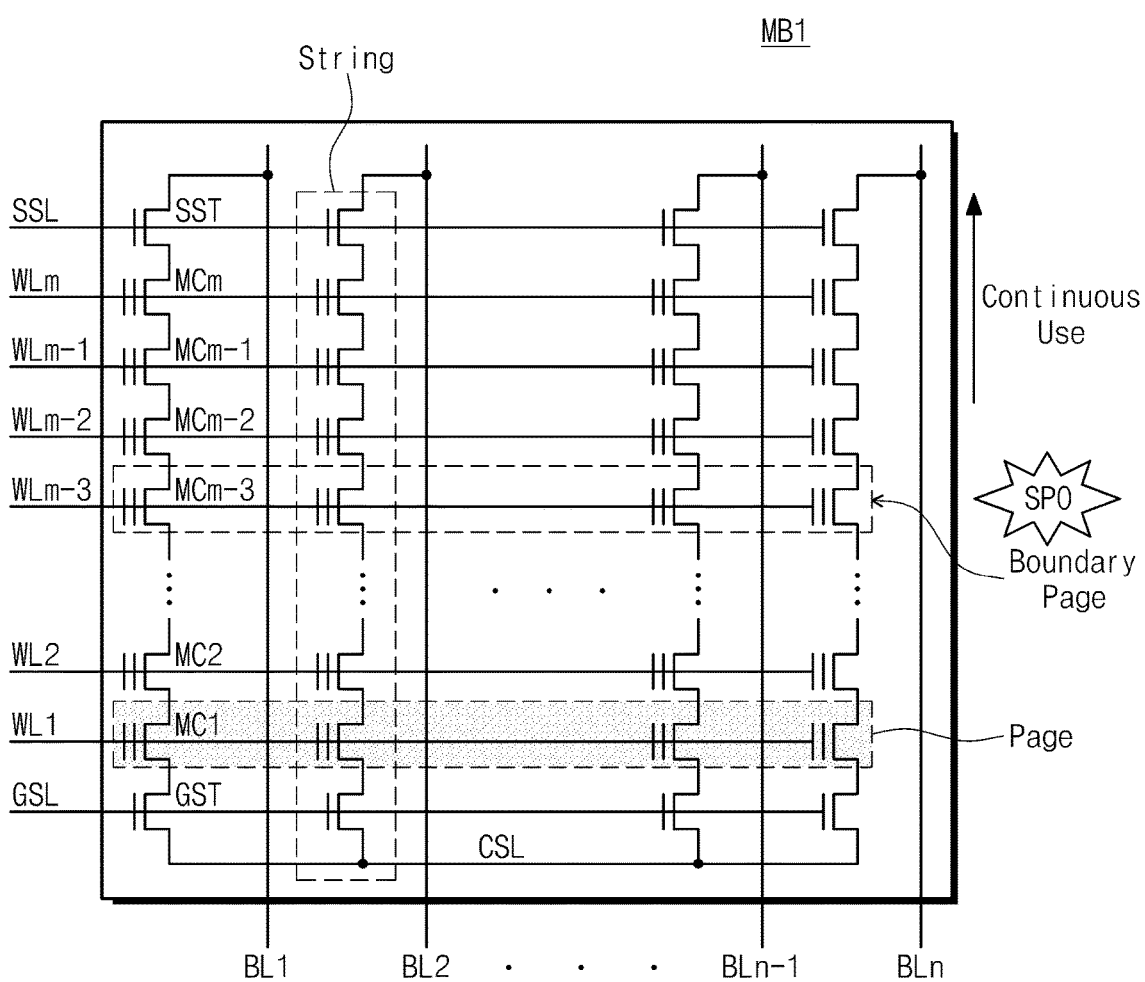
FIG. 3 is a diagram schematically illustrating a memory block shown in FIG. 2.

FIG. 3 is a diagram schematically illustrating a memory block shown in FIG. 2. Referring to FIG. 3, a memory block MB1 may include strings connected to a plurality of bit lines BL1 to BLn (n being an integer of 2 or more), respectively. Each of the strings may include at least one string selection transistor SST, a plurality of memory cells MC1 to MCm (m being an integer of 2 or more), and at least one ground selection transistor GST that are connected in series between a bit line and a common source line CSL. In each string, each memory cell may store one or more data bits.

Each of word lines WL1 to WLm may be connected to a plurality of memory cells. Memory cells connected to each word line may be referred to as a page. Word line voltages (e.g., a program voltage, a pass voltage, a read voltage, a read pass voltage, etc.) needed for driving may be applied to each of the word lines WL1 to WLm. A string selection voltage may be applied to a string selection line SSL to control the string selection transistors SST of the strings. A ground selection voltage may be applied to a ground selection line GSL to control the ground selection transistors GST of the strings.

According to at least some example embodiments of the inventive concepts, when sudden power-off is generated during a program operation of a page (i.e., a boundary page) connected to WLm-3, continuous use may be executed with respect to pages connected to word lines (e.g., WLm-2 to WLm) between the boundary page and the string selection line SSL.

Figure 4:
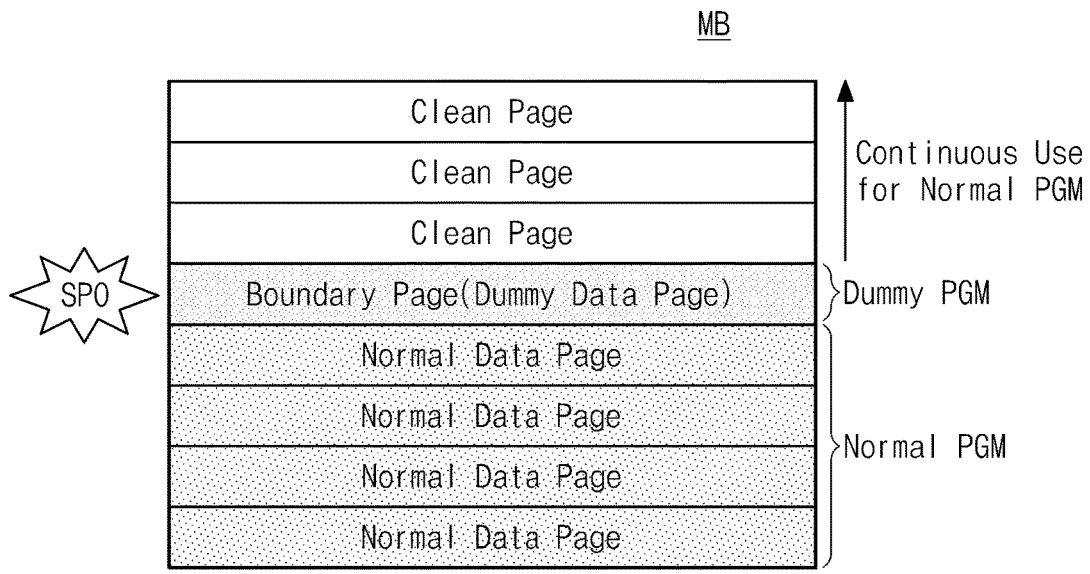
FIG. 4 is a diagram showing a program operation on a memory block according to at least some example embodiments of the inventive concepts.

FIG. 4 is a diagram showing a program operation on a memory block according to at least some embodiments of the inventive concepts. For ease of description, it is assumed that a boundary page is generated due to sudden power-off. Referring to FIG. 4, normal data pages experiencing a normal program operation may be disposed below a boundary page. A dummy data page may be generated by performing a dummy program operation on the boundary page. Clean pages where data is not written may be disposed above the boundary page. Continuous use of a normal program operation may be made with respect to clean pages.

According to at least some example embodiments of the inventive concepts, the normal program operation may be a multi-bit program operation that is executed by a reprogramming manner.

According to at least some example embodiments of the inventive concepts, the dummy program operation may be a single-bit program operation or a multi-bit program operation. According to at least some example embodiments, a program speed of the dummy program operation may be faster than that of the normal program operation.

According to at least some example embodiments of the inventive concepts, a dummy program operation on the boundary page may be executed, and then, clean pages above the boundary page may be continuously programmed.

In FIG. 4, there is illustrated an embodiment where the boundary page is dummy programmed. However, example embodiments of the inventive concepts are not limited thereto. For example, a dummy program operation on a lower page below the boundary page may be performed.

Figure 5:
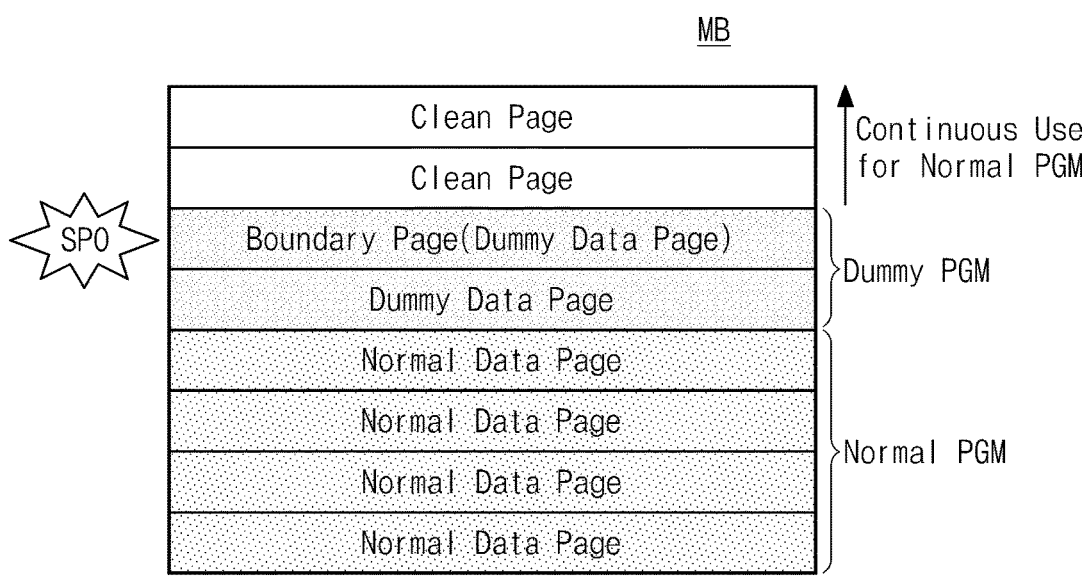
FIG. 5 is a diagram showing a program operation on a memory block according to at least second embodiment of the inventive concepts.

FIG. 5 is a diagram showing a program operation on a memory block according to at least a second embodiment of the inventive concepts. Referring to FIG. 5, a dummy program operation may be performed on a boundary page and a page immediately below the boundary page. Afterwards, continuous use for a normal program operation may be made with respect to clean pages.

According to at least some example embodiments of the inventive concepts, whether to perform a dummy program operation on a page immediately below the boundary page may be decided according to a program depth. Here, the program depth may indicate a program level of memory cells connected to a word line in a reprogramming or shadow manner ($1^{st}$ Step→$2^{nd}$ Step→$3^{rd}$ Step).

In FIG. 5, there is illustrated an embodiment where a dummy program operation is performed with respect to only a page immediately below a boundary page. However, example embodiments of the inventive concepts are not limited thereto. For example, lower pages below the boundary page may be dummy programmed.

According to at least some example embodiments of the inventive concepts, a dummy program operation on at least one lower page from a boundary page may be performed.

Figure 6:
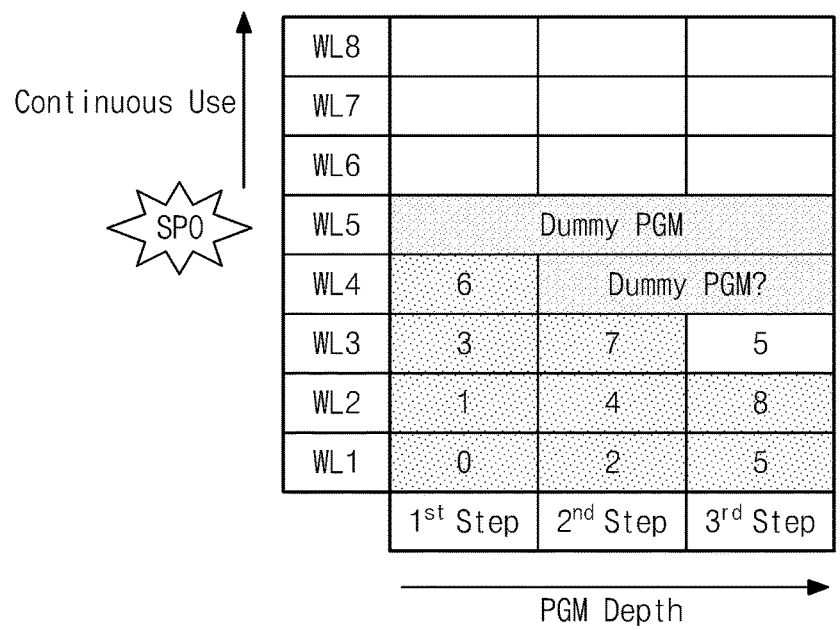
FIG. 6 is a diagram for describing a program depth according to at least some embodiments of the inventive concepts.

FIG. 6 is a diagram for describing a program depth according to at least some embodiments of the inventive concepts. In the example illustrated in FIG. 6, it is assumed that a program operation is performed according to a reprogramming manner in which a first step program operation, a second step program operation, and a third step program operation are sequentially performed ($1^{st}$ Step→$2^{nd}$ step→$3^{rd}$ Step). In FIG. 6, there is illustrated an embodiment in which sudden power-off is generated during a first step program operation on a fifth word line WL5. In this case, memory cells connected to the fifth word line WL5 may be weakly programmed.

Meanwhile, a program operation according to at least some example embodiments of the inventive concepts may not be limited to the reprogramming manner. The program operation of the inventive concepts may be performed in a shadow program manner. In this case, a first step program operation may be a single-level cell program operation, a second step program operation may be a two-level cell program operation, and a third step program operation may be a three-level program operation.

A program depth may increase in proportion to a level of a program operation. For example, program depths of first and second word lines WL1 and WL2, as illustrated in FIG. 6, may be relatively deep because they experience all the first to third step program operations.

A program depth of a third word line WL3, as illustrated in FIG. 6, may be relatively shallow because it experiences only the first and second step program operations. According to at least some example embodiments of the inventive concepts, the third step program operation on the third word line WL3, that is, a fine program operation may be performed before a dummy program operation.

A program depth of a fourth word line, as illustrated in FIG. 6, may be relatively shallower because it experiences only the first step program operation. According to at least some example embodiments of the inventive concepts, a dummy program operation may be performed on a page corresponding to the fourth word line WL4.

When the sudden power-off is generated, a page corresponding to a fifth word line WL5 may become a boundary page. The boundary page may be dummy programmed for continuous use.

According to at least some example embodiments of the inventive concepts, program depths of word lines may be obtained from a mapping table stored in a meta area 111.

According to at least some example embodiments of the inventive concepts, whether to perform a dummy program operation may be determined according to a program depth.

In example illustrated in FIGS. 5 and 6, a dummy program operation is performed on a page immediately below a boundary page. However, the inventive concepts are not limited thereto. For example, a boundary page and an upper page immediately above the boundary page may be dummy programmed.

Figure 7:
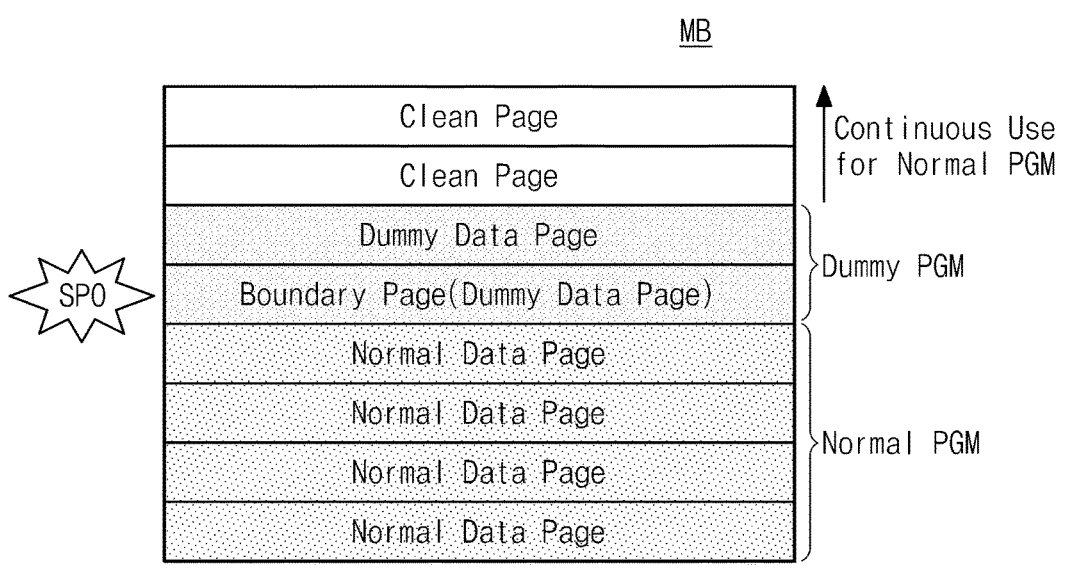
FIG. 7 is a diagram showing a program operation on a memory block according to at least a third embodiment of the inventive concepts.

FIG. 7 is a diagram showing a program operation on a memory block according to at least a third embodiment of the inventive concepts. Referring to FIG. 7, a boundary page and an upper page immediately above the boundary page may be dummy programmed. Afterwards, clean pages may be normally programmed. That is, the clean pages may be used continuously.

According to at least some example embodiments of the inventive concepts, a dummy program operation on upper pages including a boundary page may be performed without limitation.

In other exemplary embodiments, whether at least one upper page immediately above a boundary page is a clean page may be checked. As a consequence of determining that at least one upper page immediately above a boundary page is not a clean page, a dummy program operation may be performed.

In FIG. 7, there is illustrated an embodiment in which a boundary page and only one upper page immediately above the boundary page are dummy programmed. However, some example embodiments of the inventive concepts are not limited thereto. For example, a boundary page and a plurality of upper pages above the boundary page may be dummy programmed.

FIGS. 5 to 7 illustrate examples in which only one continuous use is applied to one group of contiguous memory blocks. However, example embodiments of the inventive concepts are not limited thereto. For example, continuous use may be applied to plural groups of contiguous memory blocks.

Figure 8:
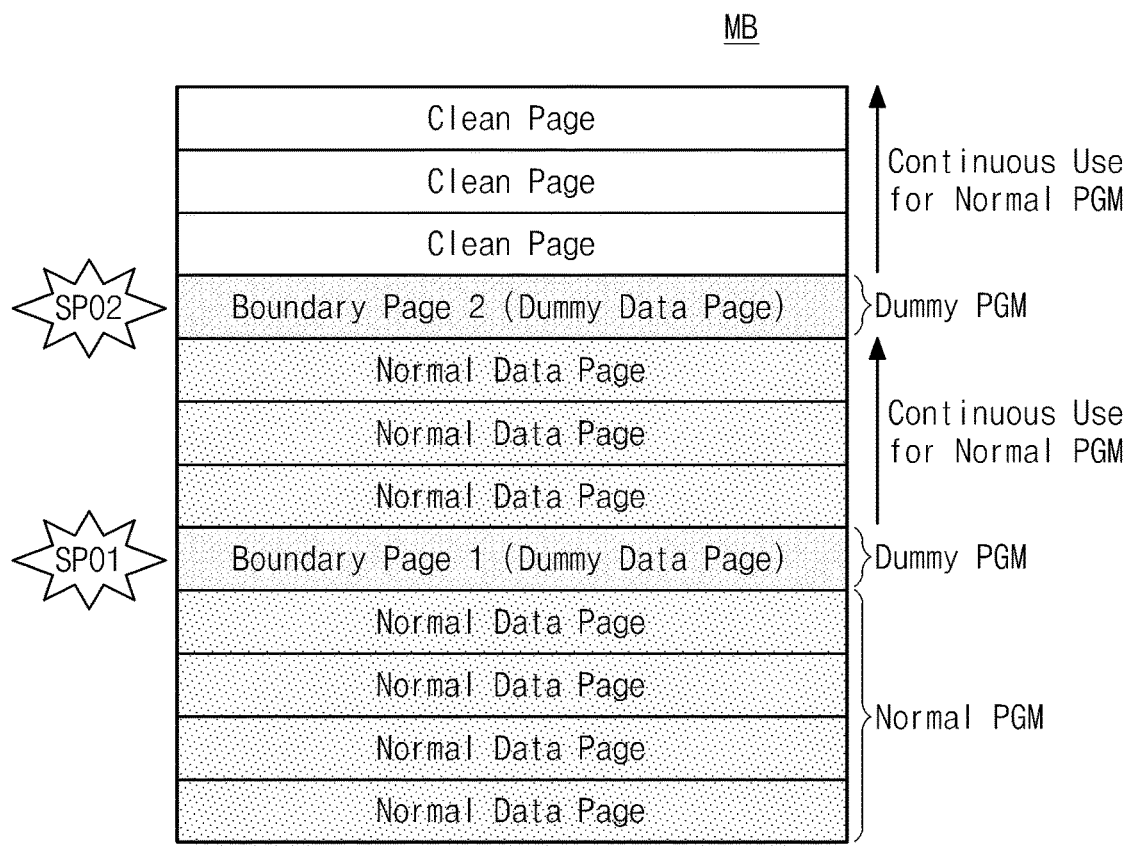
FIG. 8 is a diagram showing a program operation on a memory block according to at least a fourth embodiment of the inventive concepts.

FIG. 8 is a diagram showing a program operation on a memory block according to at least a fourth embodiment of the inventive concepts. After a dummy program operation on a first boundary page generated due to first sudden power-off SPO1 is performed, first continuous use may be made. Afterwards, second continuous use may be made after a dummy program operation on a second boundary page generated due to second sudden power-off SPO2 is performed.

According to at least some example embodiments of the inventive concepts, continuous use may be performed on plural groups of contiguous memory blocks.

Figure 9:
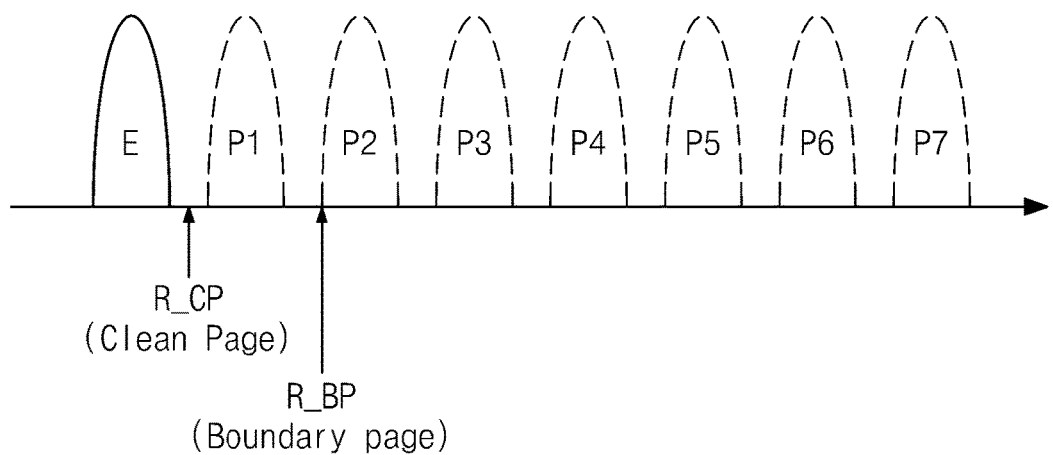
FIG. 9 is a diagram for describing a boundary page searching operation and a clean page searching operation according to at least some embodiments of the inventive concepts.

FIG. 9 is a diagram for describing a boundary page searching operation and a clean page searching operation according to at least some embodiments of the inventive concepts. For ease of description, in the example illustrated in FIG. 9, it is assumed that 3-bit data is stored in each memory cell. For example, as illustrated in FIG. 9, as a program operation is performed, a threshold voltage of memory cell may be changed to have one of erase and program states E and P1 to P7.

A boundary page read voltage R_BP may be used to search a boundary page of a memory block. A boundary page may be searched by sequentially performing read operations with the boundary page read voltage R_BP applied to word lines of the memory block. For example, if the number of memory cells connected to a particular word line and having threshold voltages higher than the boundary page read voltage R_BP is more than a predetermined or, alternatively, desired value, a page corresponding to the particular word line may be determined to be a boundary page.

A clean page read voltage R_CP may be used to search a clean page of a memory block. For example, a clean page may be searched by sequentially performing read operations with the clean page read voltage R_CP applied to a part of word lines of the memory block. For example, according to at least one example embodiment, if the number of memory cells connected to a particular word line and having threshold voltages higher than the clean page read voltage R_CP is less than a predetermined or, alternatively, desired value, a page corresponding to the particular word line may be determined to be a clean page.

According to at least some example embodiments of the inventive concepts, the clean page read voltage R_CP may be lower than the boundary page read voltage R_BP.

Figure 10:
FIG. 10 is a diagram schematically illustrating a page structure according to at least some embodiments of the inventive concepts.

FIG. 10 is a diagram schematically illustrating a page structure according to at least some embodiments of the inventive concepts. Referring to FIG. 10, according to at least some example embodiments of the inventive concepts, a page may be divided into a main area of storing user data and a spare area of storing management information for management of the user data. Here, the spare area may store information indicating whether a page experiences a dummy program operation. Thus, whether a page is a dummy data page may be determined through a read operation.

However, according to at least some example embodiments of the inventive concepts, whether a page experiences a dummy program operation need not be stored in the spare area. Since dummy data is meaningless data not to necessitate a read operation, data of the spare area may be also formed of meaningless data.

Figure 11:
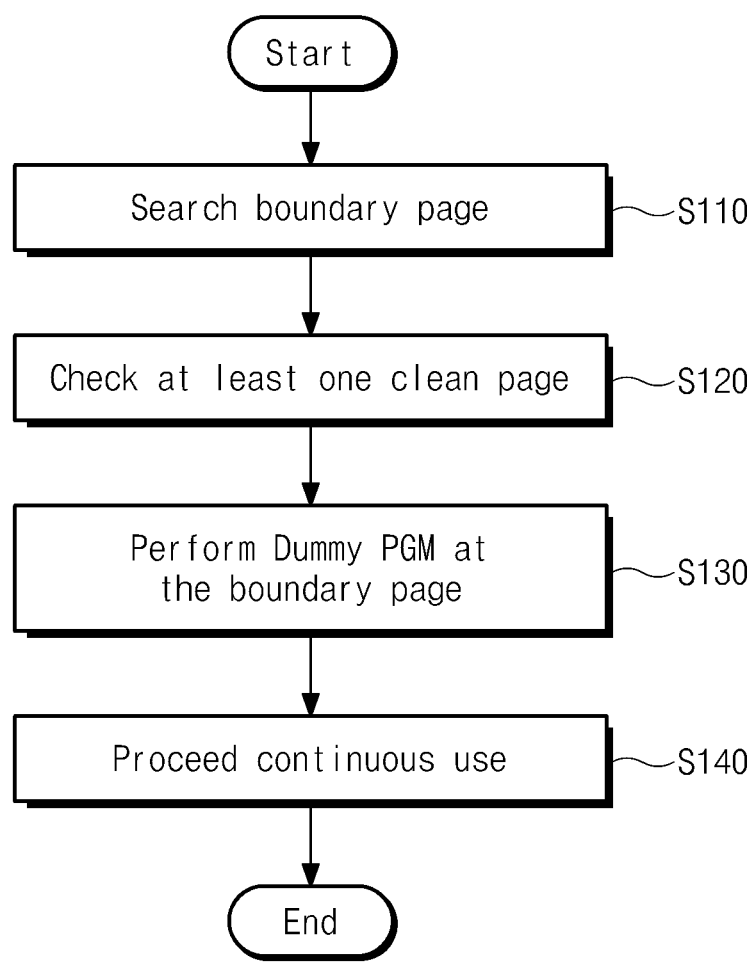
FIG. 11 is a flow chart schematically illustrating a program method of a storage device 10, according to a first embodiment of the inventive concepts.

FIG. 11 is a flow chart schematically illustrating a program method of a storage device 10, according to a first embodiment of the inventive concepts. A program method will be more fully described with reference to FIGS. 2 to 11.

If, at power-on, a storage device 10 recognizes that sudden power-off was generated, in step S110, a boundary page search operation may be performed to search a boundary page of a memory block at which sudden power-off was generated during a program operation. Here, the boundary page search operation may be performed as described with reference to FIG. 9. After a boundary page is searched, in step S120, a clean page search operation may be performed to check a state of at least one clean page above the boundary page. Here, the clean page search operation may be performed as described with reference to FIG. 9.

In step S130, a dummy program operation on the boundary page may be performed. At this time, a page immediately below the boundary page may be dummy programmed based on a program depth, or a page immediately above the boundary page may be dummy programmed according to a state of a clean page. According to at least some example embodiments of the inventive concepts, if a state of the clean page is determined not to be good at a clean page search operation, a dummy program operation may not be performed. After the dummy program operation is performed, in step S140, contiguous clean pages immediately below the boundary page may be used continuously.

With the program method according to at least some example embodiments of the inventive concepts, clean pages may be continuously used after the boundary page is dummy programmed such that contiguous groups of clean pages are used.

FIG. 11 illustrates an example in which a boundary page is searched before a dummy program operation. However, according to at least some example embodiments of the inventive concepts, a search for a boundary page may not be performed. For example, a dummy program operation may be performed after searching an initial clean page, for a previous page of the initial clean page may be determined to be a boundary page.

Figure 12:
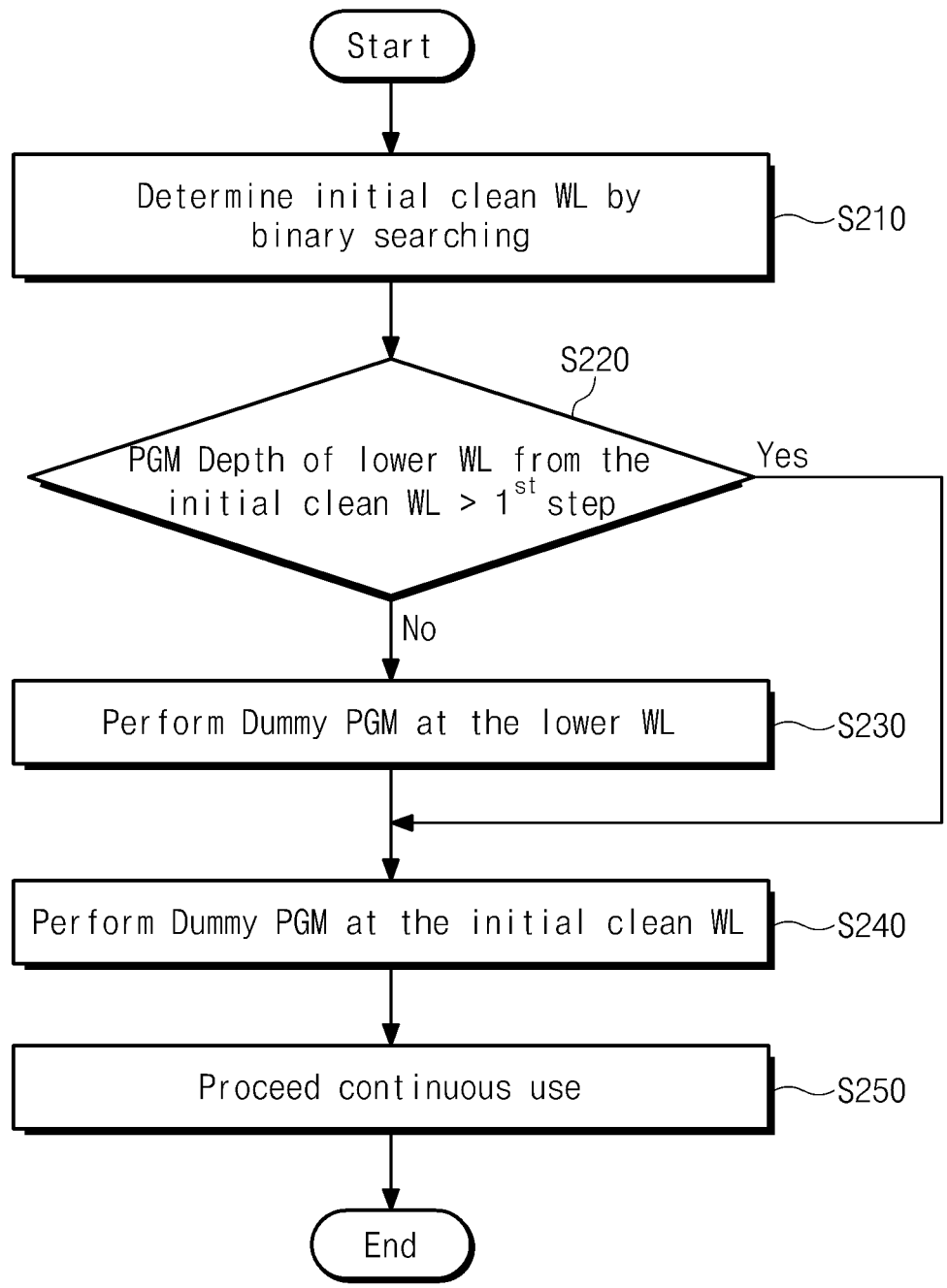
FIG. 12 is a flow chart schematically illustrating a program method of a storage device, according to at least a second embodiment of the inventive concepts.

FIG. 12 is a flow chart schematically illustrating a program method of a storage device 10, according to at least a second embodiment of the inventive concepts. A program method will be more fully described with reference to FIGS. 2 to 10 and 12.

In step S210, an initial clean word line may be searched through binary searching on a target memory block. For example, the initial clean word line may be decided through a clean page search operation on word lines as described with reference to FIG. 9. In this case, likelihood that a page corresponding to a word line immediately below the initial clean word line is a boundary page may be high. In step S220, whether a program depth of the lower word line is deeper than that of a first step program operation may be determined.

If a program depth of the word line immediately below the initial clean word line is not deeper than that of the first step program operation, in step S230, a dummy program operation on the lower word line may be performed. Afterwards, in step S240, a dummy program operation on the initial clean word line may be performed. On the other hand, if a program depth of the word line immediately below the initial clean word line is deeper than that of the first step program operation, the method proceeds to step S240 without a dummy program operation on the lower word line. Afterwards, in step S250, continuous use on clean pages above the initial clean word line may be made.

With the program method according to at least some example embodiments of the inventive concepts, after a dummy program operation on an initial clean word line searched is performed, continuous use may be made with respect to clean pages.

Figure 13:
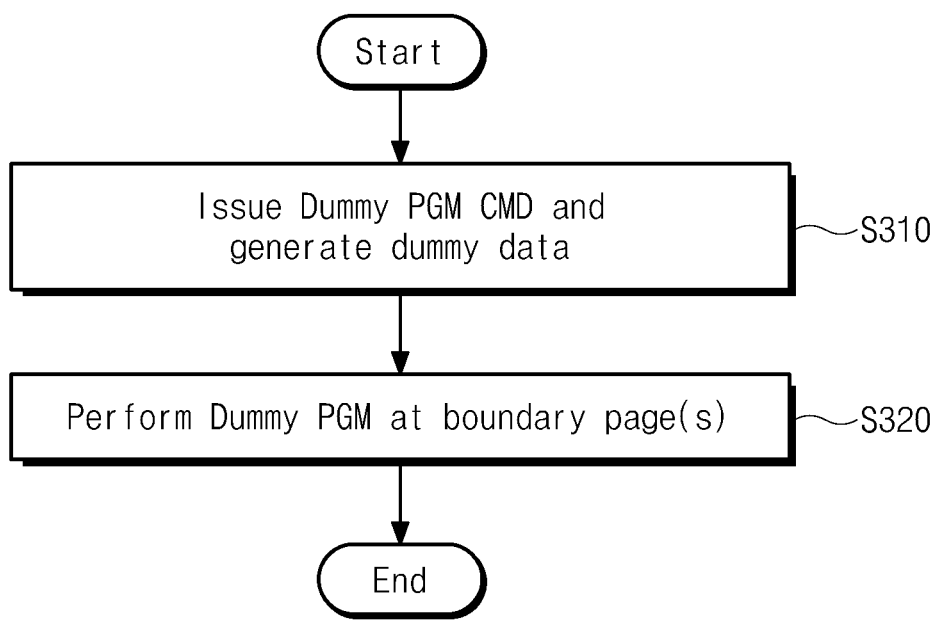
FIG. 13 is a flow chart schematically illustrating a dummy program operation according to at least some embodiments of the inventive concepts.

FIG. 13 is a flow chart schematically illustrating a dummy program operation according to at least some embodiments of the inventive concepts. A dummy program operation will be more fully described with reference to FIG. 13.

For example, the memory controller 200 (refer to FIG. 1) may determine whether a dummy program operation is required. If so, in step S310, the memory controller 200 may issue a dummy program command, and the memory controller 200 may generate dummy data. According to at least some example embodiments of the inventive concepts, the dummy program command may be a particular program command. In at least some other example embodiments of the inventive concepts, the dummy program command may be a normal program command. According to at least some example embodiments of the inventive concepts, the dummy data may be random data using an address corresponding to a boundary page as a seed value.

For example, the nonvolatile memory device 100 (refer to FIG. 1) may receive the dummy program command, the address corresponding to the boundary page, and the dummy data, and the nonvolatile memory device 100 may perform a dummy program operation on one or more boundary pages.

The dummy program operation according to at least some embodiments of the inventive concepts may generate dummy data to program the dummy data at a boundary page.

According to at least some example embodiments of the inventive concepts, it is possible to structure and/or operate the storage device 10 such that the dummy data program operation is faster compared with a program speed of a normal program operation.

Figure 14:
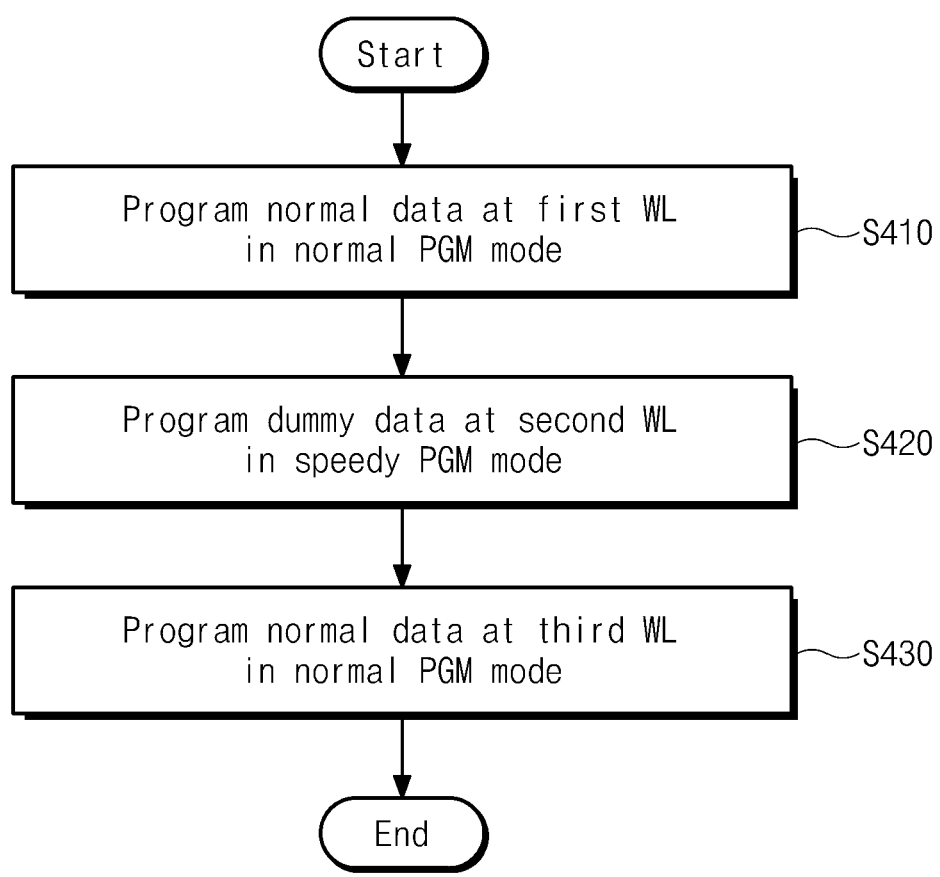
FIG. 14 is a flow chart schematically illustrating a program method of a storage device, according to at least a third embodiment of the inventive concepts.

FIG. 14 is a flow chart schematically illustrating a program method of a storage device 10, according to at least a third embodiment of the inventive concepts. A program method will be more fully described with reference to FIGS. 2 to 10 and 14.

In step S410, normal data may be programmed at memory cells connected to a first word line at a normal program mode. When sudden power-off is generated during a program operation on a second word line above the first word line, in step S420, dummy data may be programmed at memory cells (e.g., a boundary page) connected to the second word line using a speedy program mode. Here, a program speed of the speedy program mode may be faster than that of the normal program mode.

According to at least some example embodiments of the inventive concepts, the speedy program mode may be a single level cell (SLC) program operation mode, and the normal program mode may be a multi-level cell (MLC) program operation mode. In other exemplary embodiments, the speedy program mode may be an SLC or MLC program operation mode which does not include a verification operation. Afterwards, in step S430, normal data may be programmed at memory cells (e.g., a clean page) connected to a third word line above the second word line.

With the program method according to at least some example embodiments of the inventive concepts, a dummy program operation may be performed using a speedy program mode the program speed of which is relatively fast.

Meanwhile, reliability on dummy data need not be secured at a dummy program operation. According to at least some example embodiments of the inventive concepts, although the reliability of dummy data is low, a dummy program operation may be performed to reduce pass voltage disturbance on unselected word lines.

Figure 15:
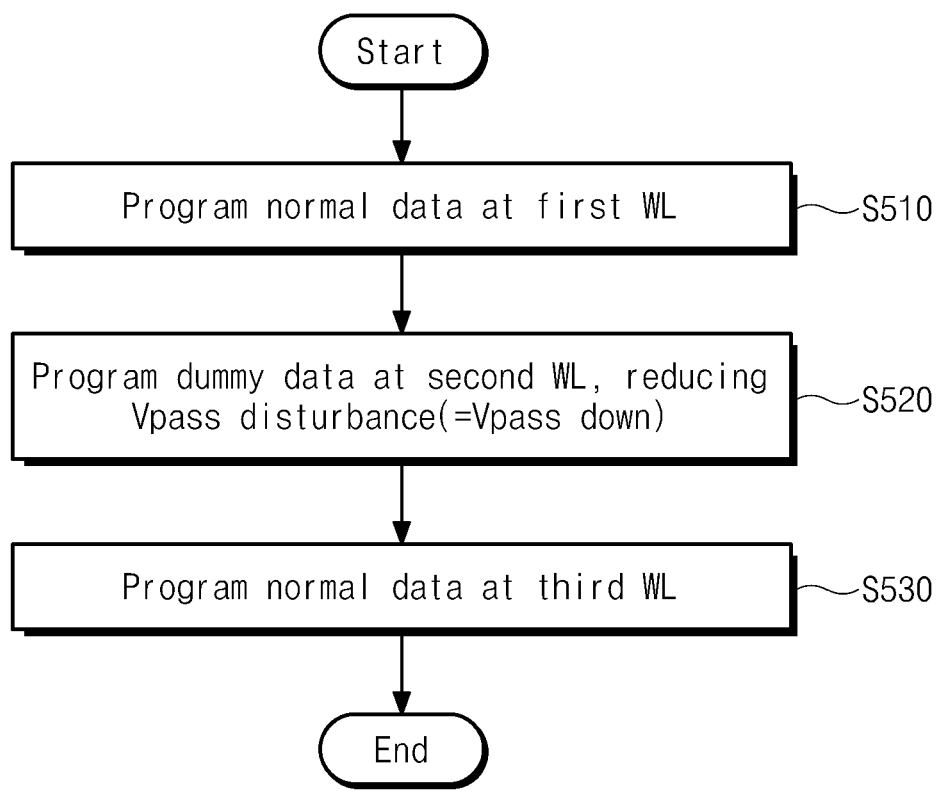
FIG. 15 is a flow chart schematically illustrating a program method of a storage device, according to at least a fourth embodiment of the inventive concepts.

FIG. 15 is a flow chart schematically illustrating a program method of a storage device 10, according to at least a fourth embodiment of the inventive concepts. A program method will be more fully described with reference to FIGS. 2 to 10 and 15.

In step S510, normal data may be programmed at memory cells connected to a first word line. When sudden power-off is generated during a program operation on a second word line above the first word line, dummy data may be programmed at memory cells (e.g., a boundary page) connected to the second word line. In step S520, a pass voltage lower than the pass voltage used in a normal program operation may be applied to unselected word lines. In step S530, normal data may be programmed at memory cells (e.g., a clean page) connected to a third word line above the second word line.

With the program method of the inventive concepts, a dummy program operation may be carried out to reduce pass voltage disturbance.

Further, at least some example embodiments of the inventive concepts are applicable to a reprogram operation.

Figure 16:
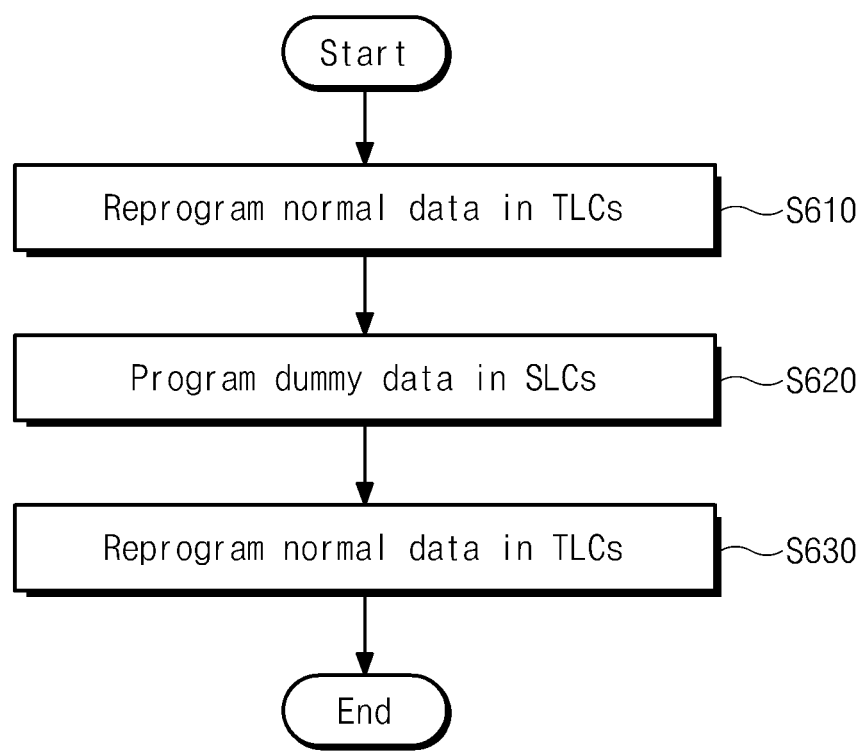
FIG. 16 is a flow chart schematically illustrating a program method of a storage device, according to at least a fifth embodiment of the inventive concepts.

FIG. 16 is a flow chart schematically illustrating a program method of a storage device 10, according to at least a fifth embodiment of the inventive concepts. A program method will be more fully described with reference to FIGS. 2 to 10 and 16.

In step S610, normal data may be reprogrammed at triple level cells. After sudden power-off is generated, in step S620, dummy data may be programmed at single level cells. Here, the single level cells may be memory cells included in a boundary page. After the dummy data program operation, in step S630, normal data may be reprogrammed at triple level cells.

With the program method of the inventive concepts, normal data may be programmed using TLC reprogramming, and dummy data may be programmed using SLC programming.

FIGS. 2 to 16 illustrate examples of a program operation performed when sudden power-off is generated. However, example embodiments of the inventive concepts are not limited thereto. For example, whether to perform a dummy program operation may be decided according to one of various conditions including, but are not limited to, a request of a host, sudden power-off SPO of a nonvolatile memory device, or a request according to management (e.g., a controller) of the nonvolatile memory device.

Figure 17:
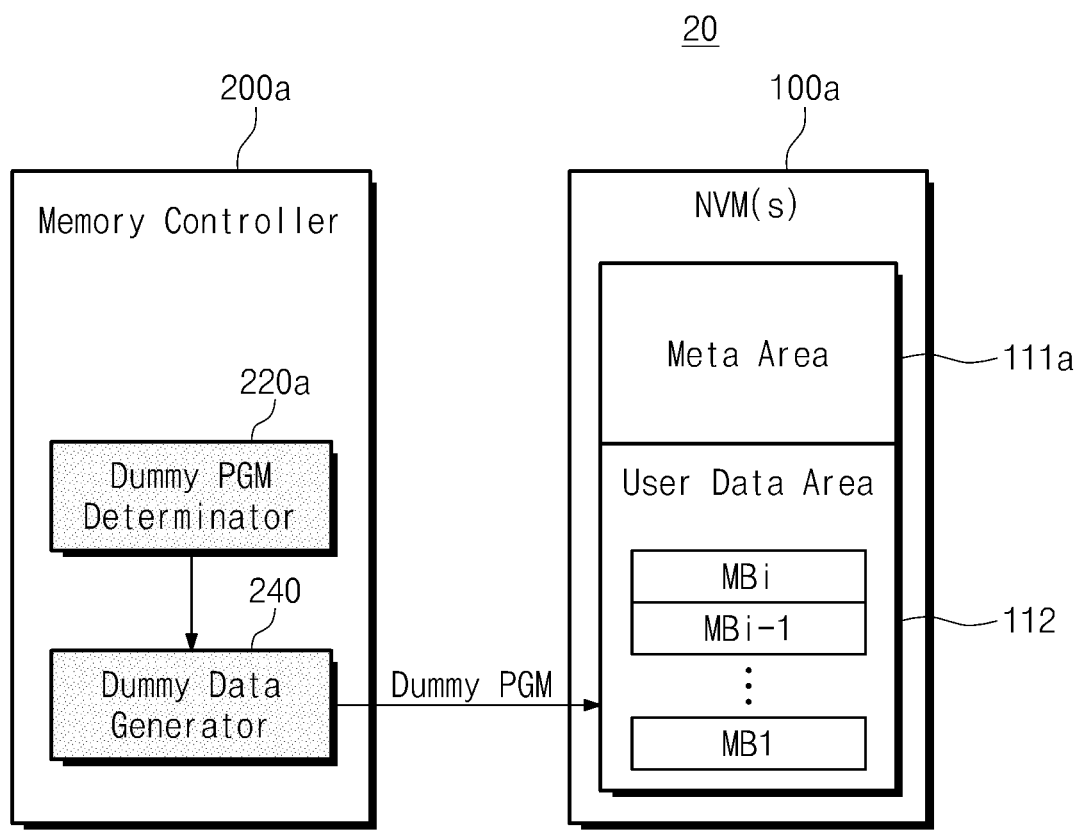
FIG. 17 is a block diagram schematically illustrating a storage device according to at least another embodiment of the inventive concepts.

FIG. 17 is a block diagram schematically illustrating a storage device according to at least another embodiment of the inventive concepts. Referring to FIG. 17, a storage device 20 may include a nonvolatile memory device 100a and a memory controller 200a controlling the nonvolatile memory device 100a.

The memory controller 200a may include a dummy program determinator 220a and a dummy data generator 240. If improvement of boosting efficiency is required according to a host's request or at a program operation, the dummy program determinator 220a may decide to perform a dummy program operation on a corresponding page. The dummy data generator 240 may be, for example, a random data generator.

The storage device 200 according to at least some example embodiments of the inventive concepts may be configured to decide whether to perform a dummy program operation according to a request of an external device or an internal decision.

The storage devices 10 and 20 include one or more hardware processors configured to perform specific operations included in program code, or structurally configured to perform specific operations. For example, the one or more hardware processors may be included in the memory controllers 200 and 200a and may be configured to perform any of the operations described herein as being performed by the storage device 10 or the storage device 20. For example, the one or more hardware processors may include at least one of a central processing unit (CPU), a digital signal processor (DSP), a multiprocessor, a field programmable gate array (FPGA), and an application specific integrated circuit (ASIC).

At least some example embodiments of the inventive concepts are applicable to VNAND.

Figure 18:
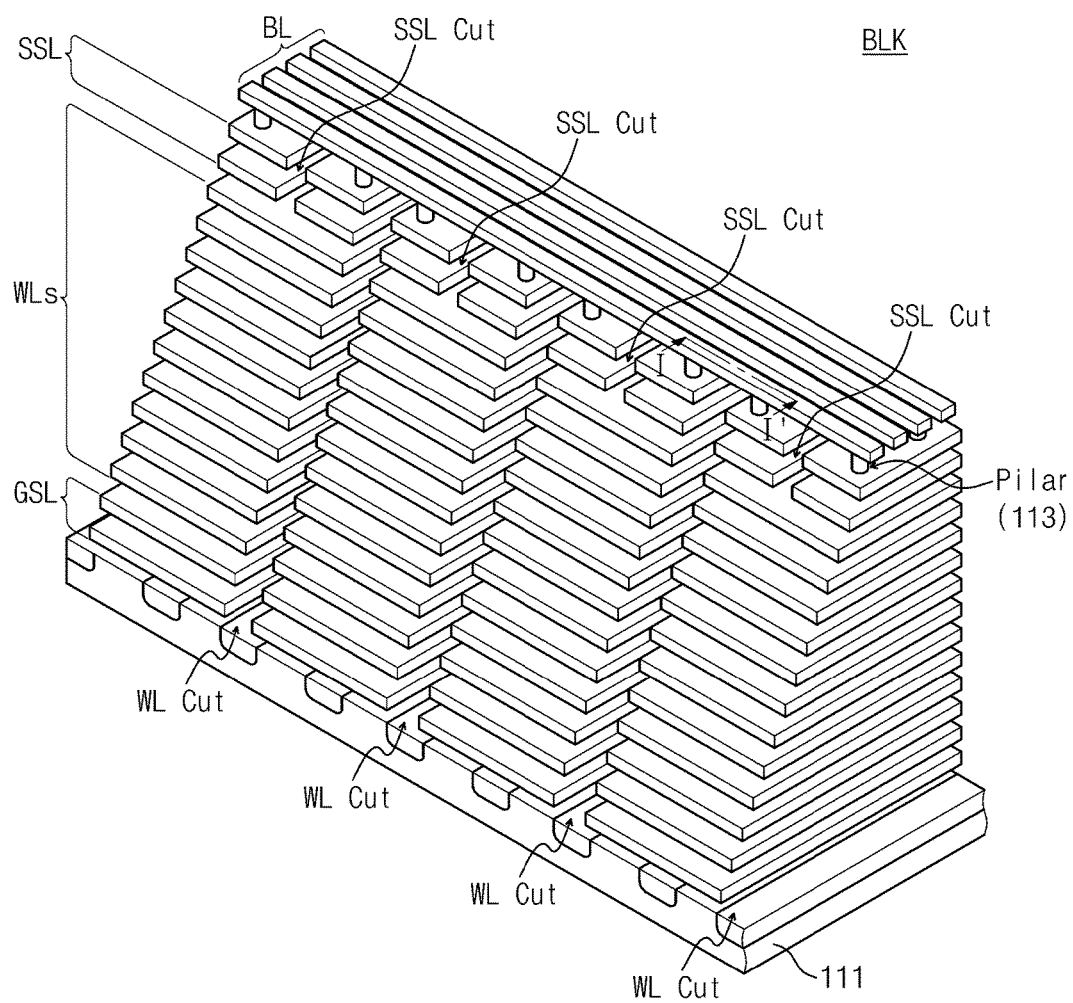
FIG. 18 is a perspective view of a VNAND block of according to at least some embodiments of the inventive concepts.

FIG. 18 is a perspective view of a VNAND block of according to at least some embodiments of the inventive concepts. Referring to FIG. 18, four sub blocks may be formed on a substrate. Each sub block may be formed by stacking at least one ground selection line GSL, a plurality of word lines, and at least one string selection line SSL on the substrate and between word line cuts in a plate shape. The string selection line SSL may be separated by string selection line cuts. Although not shown in FIG. 18, each word line cut may include a common source line CSL. According to at least some example embodiments of the inventive concepts, the common source lines CSL included in the word line cuts may be interconnected. A string may be formed by making a pillar 113 connected to a bit line penetrate the at least one string selection line SSL, the word lines, and the at least one ground selection line GSL.

FIG. 18 illustrates an example in which a structure between word line cuts is a sub block. However, example embodiments of the inventive concepts are not limited thereto. For example, a structure between a word line cut and a string selection line cut may be defined as a sub block.

The memory block BLK according to at least some embodiments of the inventive concepts may be implemented to have a merged word line structure where two word lines are merged to one.

At least some example embodiments of the inventive concepts are applicable to a solid state drive (SSD).

Figure 19:
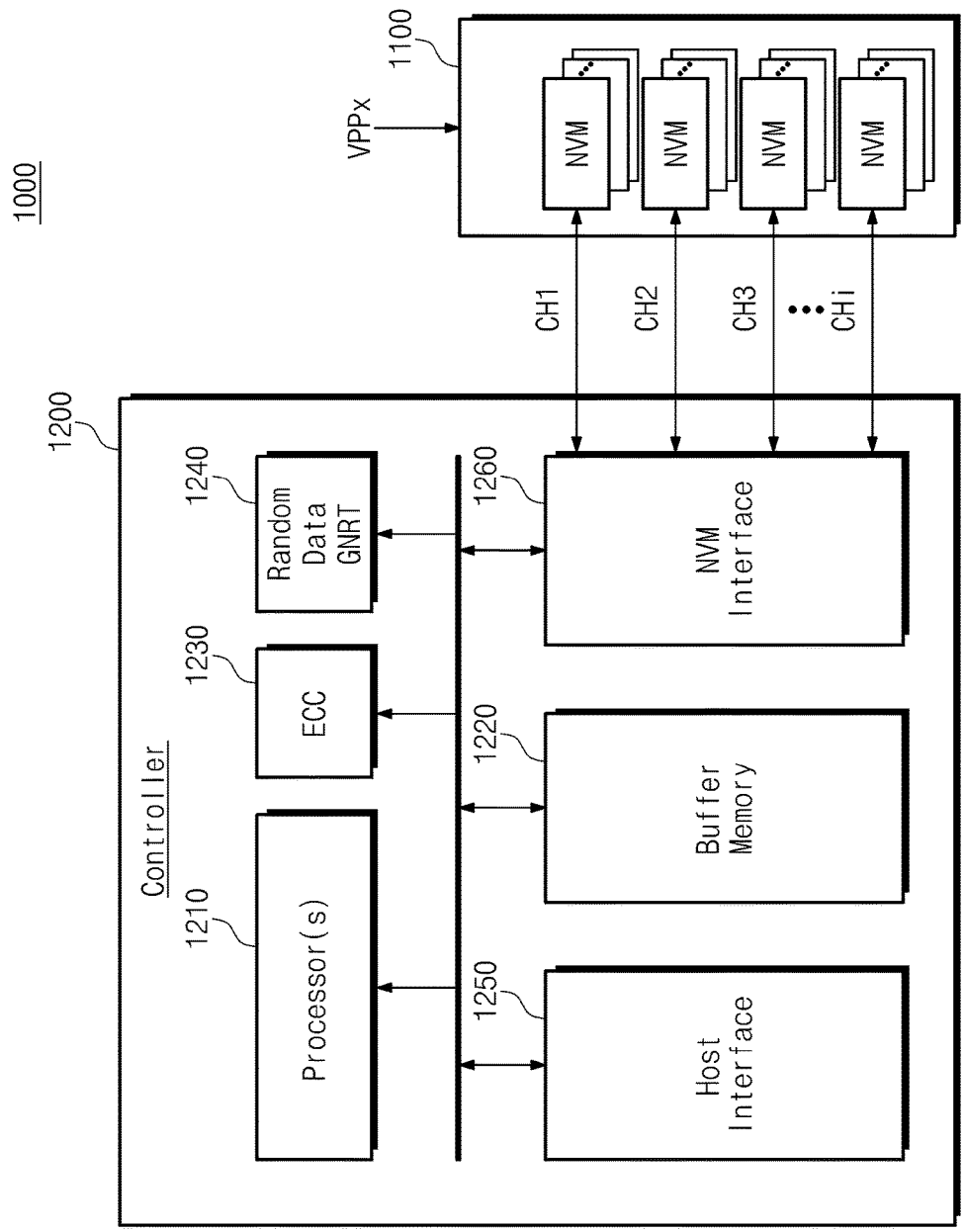
FIG. 19 is a block diagram schematically illustrating a solid state drive according to at least some embodiments of the inventive concepts.

FIG. 19 is a block diagram schematically illustrating a solid state drive according to at least some embodiments of the inventive concepts. Referring to FIG. 19, a solid state drive (hereinafter, referred to as SSD) 1000 includes a plurality of nonvolatile memory devices 1100 and an SSD controller 1200. The one or more flash memory devices 1100 may include the structure and have the same operation described above with reference to the nonvolatile memories 100 or 100a. The controller 1200 may include the structure and have the same operation described above with reference to the memory controllers 200 or 200a.

The nonvolatile memory devices 1100 may be implemented to be provided with an external high voltage VPPx optionally.

The SSD controller 1200 may be connected to the nonvolatile memory devices 1100 through a plurality of channels CH1 to CHi (i being an integer of 2 or more). The SSD controller 1200 may include one or more processors 1210, a buffer memory 1220, an ECC block 1230, a random data generator 1240, a host interface 1250, and a nonvolatile memory interface 1260. The SSD controller 1200 may decide whether to perform a dummy program operation on a memory block and may be implemented to do continuous use after the dummy program operation.

The one or more processors 1210 are hardware devices configured to perform specific operations include in program code, or structurally configured to perform specific operations. For example, the one or more processors 1210 may be configured to perform any of the operations described herein as being performed by the storage device 10 or the storage device 20. For example, the one or more processors 1210 may include at least one of a central processing unit (CPU), a digital signal processor (DSP), a multiprocessor, a field programmable gate array (FPGA), and an application specific integrated circuit (ASIC).

The buffer memory 1220 may store data needed to drive the SSD controller 1200. According to at least some example embodiments of the inventive concepts, the buffer memory 1220 may include a plurality of memory lines each storing data or a command. In FIG. 19, there is illustrated an embodiment in which the buffer memory 1220 is included in the SSD controller 1200. However, example embodiments of the inventive concepts are not limited thereto. For example, the buffer memory 1220 may be placed outside the SSD controller 1200.

The ECC block 1230 may calculate error correction code values of data to be programmed at a writing operation and may correct an error of read data using an error correction code value at a read operation. At a data recovery operation, the ECC block 1230 may correct an error of data recovered from the nonvolatile memory devices 1100. Although not shown in FIG. 19, a code memory may be further included to store code data needed to drive the SSD controller 1200. The code memory may be implemented by a nonvolatile memory device.

The random data generator 1240 may generate random data using a seed value. In particular, the random data generator 1240 may generate dummy data using an address corresponding to a target of a dummy program operation as a seed value.

The host interface 1250 may provide an interface with an external device. The nonvolatile memory interface 1260 may provide an interface with the nonvolatile memory devices 1100.

The SSD 1000 according to at least some embodiments of the inventive concepts may reduce an interface layout area by increasing the freedom of SI lines according to an address.

The inventive concepts are applicable to an eMMC (e.g., an embedded multimedia card, moviNAND, iNAND, etc.).

Figure 20:
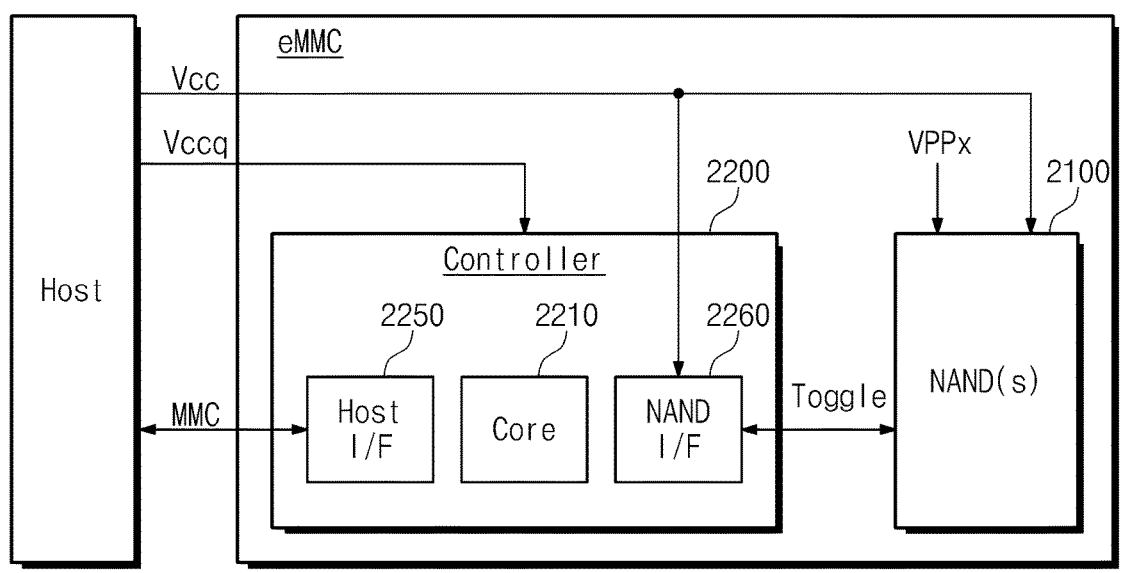
FIG. 20 is a block diagram schematically illustrating an eMMC according to at least some embodiments of the inventive concepts.

FIG. 20 is a block diagram schematically illustrating an eMMC according to at least some embodiments of the inventive concepts. Referring to FIG. 20, an eMMC 2000 may include one or more NAND flash memory devices 2100 and a controller 2200. The one or more flash memory devices 2100 may include the structure and have the same operation described above with reference to the nonvolatile memories 100 or 100a. The controller 2200 may include the structure and have the same operation described above with reference to the memory controllers 200 or 200a. The eMMC 2000 may include one or more hardware processors configured to perform specific operations included in program code, or structurally configured to perform specific operations. For example, the one or more hardware processors included in the eMMC 2000 may be configured to perform any of the operations described herein as being performed by the storage device 10 or the storage device 20. For example, the one or more processors included in the eMMC 2000 may include at least one of a central processing unit (CPU), a digital signal processor (DSP), a multiprocessor, a field programmable gate array (FPGA), and an application specific integrated circuit (ASIC). The one or more controller cores 2200 are examples of the one or more processors discussed above as being included in the eMMC 2000.

The NAND flash memory device 2100 may include memory blocks in which continuous use is possible as illustrated in FIG. 1.

The controller 2200 may be connected with the NAND flash memory device 2100 via a plurality of channels. The controller 2200 may include one or more controller cores 2210, a host interface 2250, and a NAND interface 2260. The controller core 2210 may control an overall operation of the eMMC 2000. The host interface 2250 may be configured to perform an interface between the controller 2210 and a host. The NAND interface 2260 may be configured to provide an interface between the NAND flash memory device 2100 and the controller 2200. In example embodiments, the host interface 2250 may be a parallel interface (e.g., an MMC interface). In other example embodiments, the host interface 2250 of the eMMC 2000 may be a serial interface (e.g., UHS-II, UFS, etc.).

The controller 2200 may search a boundary page for continuous use to perform a dummy program operation on the searched boundary page.

The eMMC 2000 may receive power supply voltages Vcc and Vccq from the host. Herein, the power supply voltage Vcc (e.g., about 3.3V) may be supplied to the NAND flash memory device 2100 and the NAND interface 2260, and the power supply voltage Vccq (e.g., about 1.8V/3.3V) may be supplied to the controller 2200. According to at least some example embodiments of the inventive concepts, the eMMC 2000 may be optionally supplied with an external high voltage.

The eMMC 2000 according to at least some embodiments of the inventive concepts may improve data reliability and lifetime through continuous use.

The inventive concepts are applicable to universal flash storage (UFS).

Figure 21:
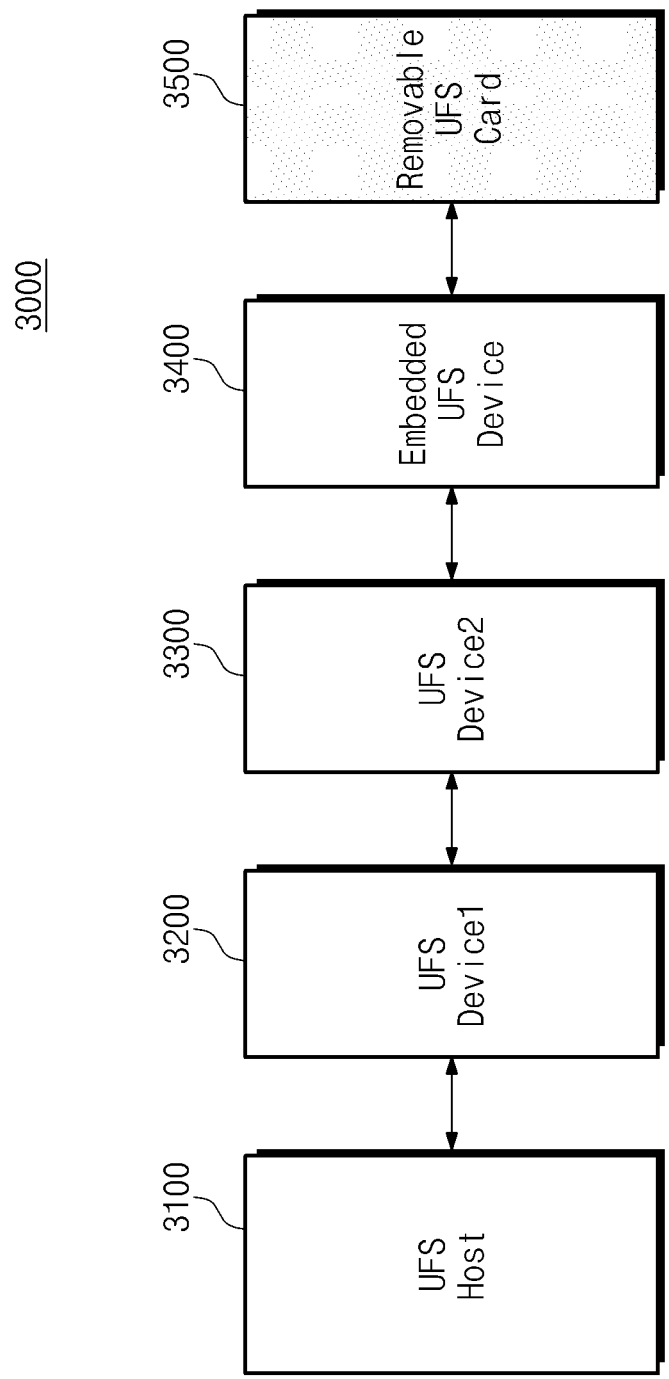
FIG. 21 is a block diagram schematically illustrating a UFS system according to at least some embodiments of the inventive concepts.

FIG. 21 is a block diagram schematically illustrating a UFS system according to at least some embodiments of the inventive concepts. Referring to FIG. 21, a UFS system 3000 may include a UFS host 3100, UFS devices 3200 and 3300, an embedded UFS device 3400, and a removable UFS card 3500. The UFS host 3100 may be an application processor of a mobile device. Each of the UFS host 3100, the UFS devices 3200 and 3300, the embedded UFS device 3400, and the removable UFS card 3500 may communicate with external devices through the UFS protocol. At least one of the UFS devices 3200 and 3300, the embedded UFS device 3400, and the removable UFS card 3500 may be implemented by a storage device show in FIG. 2 or 17. The UFS system 3000 may include the structure and have the same operation described above with reference to the nonvolatile memories 100 or 100a. The UFS system 3000 may include the structure and have the same operation described above with reference to the memory controllers 200 or 200a. The UFS system may include one or more hardware processors configured to perform specific operations included in program code, or structurally configured to perform specific operations. For example, the one or more hardware processors included in the UFS system 3000 may be configured to perform any of the operations described herein as being performed by the storage device 10 or the storage device 20. For example, the one or more processors included in the UFS system 3000 may include at least one of a central processing unit (CPU), a digital signal processor (DSP), a multiprocessor, a field programmable gate array (FPGA), and an application specific integrated circuit (ASIC).

Meanwhile, the embedded UFS device 3400 and the removable UFS card 3500 may perform communications using protocols different from the UFS protocol. The UFS host 3100 and the removable UFS card 3500 may communicate through various card protocols (e.g., UFDs, MMC, SD (secure digital), mini SD, Micro SD, etc.).

The inventive concepts are applicable to a mobile device.

Figure 22:
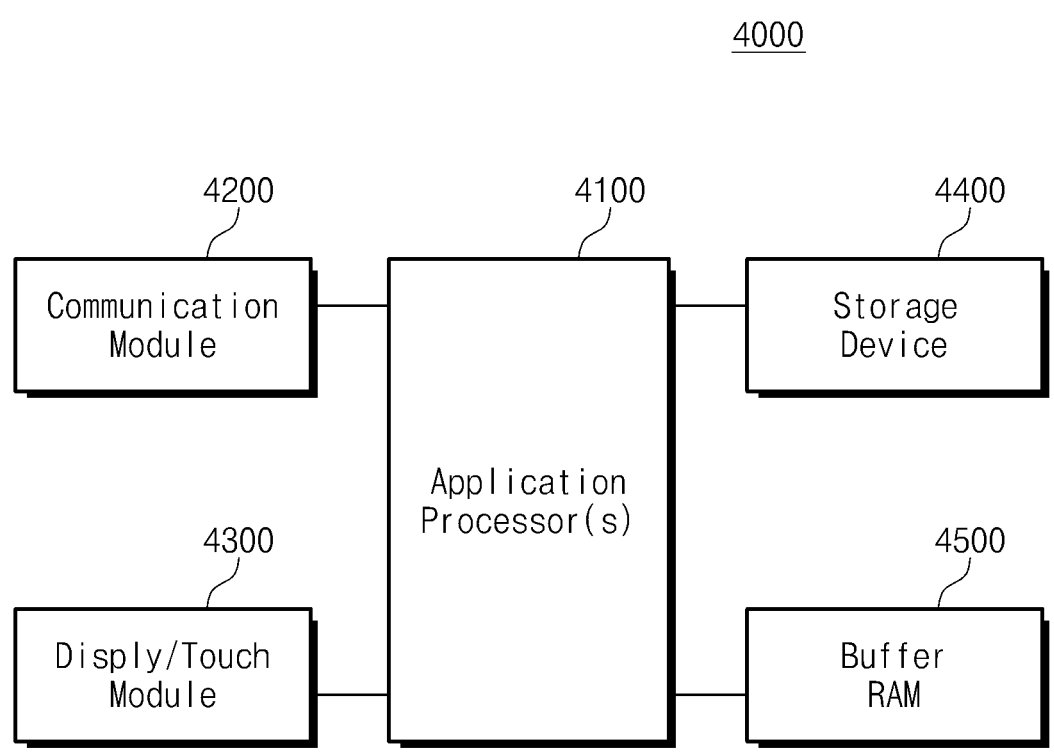
FIG. 22 is a block diagram schematically illustrating a mobile device according to at least some embodiments of the inventive concepts.

FIG. 22 is a block diagram schematically illustrating a mobile device 4000 according to at least some embodiments of the inventive concepts. Referring to FIG. 22, a mobile device 4000 may include an application processor 4100, a communication module 4200, a display/touch module 4300, a storage device 4400, and a buffer RAM 4500.

The application processor 4100 may control an overall operation of the mobile device 4000. The communication module 4200 may be implemented to perform wireless or wire communications with an external device. The display/touch module 4300 may be implemented to display data processed by the application processor 4100 or to receive data through a touch panel. The storage device 4400 may be implemented to store user data. The storage device 4400 may be eMMC, SSD, UFS device, etc. The storage device 4400 may be a storage device show in FIG. 2 or 17.

The buffer RAM 4500 may be implemented to store data needed for a processing operation of the mobile device 4000 temporarily.

The storage device 4400 may include the structure and have the same operation described above with reference to the nonvolatile memories 100 or 100a. The storage device 4400 may include the structure and have the same operation described above with reference to the memory controllers 200 or 200a. The mobile device 4000 may include one or more hardware processors configured to perform specific operations included in program code, or structurally configured to perform specific operations. For example, the one or more hardware processors included in the mobile device 4000 may be configured to perform any of the operations described herein as being performed by the storage device 10 or the storage device 20. For example, the one or more processors included in the mobile device 4000 may include at least one of a central processing unit (CPU), a digital signal processor (DSP), a multiprocessor, a field programmable gate array (FPGA), and an application specific integrated circuit (ASIC).

The mobile device 4000 according to at least some embodiments of the inventive concepts may improve system performance by managing memory blocks efficiently to cope with periodical sudden power-off.

A memory system or a storage device according to at least some embodiments of the inventive concepts may be packed using various packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

Example embodiments having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A method for programming a storage device, the storage device including a nonvolatile memory device and a memory controller, the nonvolatile memory device including a user data area and a meta area, the user data area including a plurality of memory blocks, each memory block including a plurality of pages, each page being programmed in sequential order, the method comprising:
   reading power information stored in the meta area after power-on of the storage device, wherein the power information indicates one of normal power-off and sudden power-off;
   searching a boundary page in the memory blocks if the power information indicates the sudden power-off, the boundary page being the last programmed page before the sudden power-off;
   performing a dummy program operation on the boundary page; and
   performing a normal program operation on the initial clean page, wherein the initial clean page is a clean page a couple of adjacent to the boundary page.

2. The method of claim 1, wherein the method further includes setting the power information as normal power-off in response to a power-off notification issued from a host before power-off of the storage device.

3. The method of claim 2, wherein the power information maintains the sudden power-off if the power-off notification is not issued.

4. The method of claim 2, wherein the power-off notification is issued by the host when a power is normally turned off.

5. The method of claim 1, wherein the searching a boundary page includes reading the meta area in which information relating to the boundary page is stored.

6. The method of claim 1, wherein the searching a boundary page includes reading the user data area for finding the boundary page with binary searching manner.

7. The method of claim 1, wherein the method further includes generating dummy data by the memory controller upon completion of searching the boundary page;
   and wherein the dummy data are random data using the address corresponding to the boundary page as a seed value.

8. The method of claim 7, wherein the dummy program operation is performed by a dummy write command sent by the memory controller to the nonvolatile memory, and the dummy write command includes the dummy data and an address corresponding to the boundary page, wherein the dummy data and the address are generated regardless of request of a host.

9. The method of claim 1, wherein the normal program operation are performed before the erase of the dummy data.

10. The method of claim 1, wherein the performing a dummy program operation comprises:
    determining a program depth of at least one lower page before the boundary page; and
    when the program depth is less than a desired value, performing a dummy program operation on the at least one lower page.

11. The method of claim 1, wherein the performing a dummy program operation comprises:
    determining whether at least one upper page next to the boundary page is a clean page, the clean page being a page that is in an erase state; and
    when the determining indicates that the at least one upper page is not the clean page, performing a dummy program operation on the at least one upper page.

12. The method of claim 1, wherein the method further includes performing a normal program operation on a clean page adjacent to the normal data pages if the power information indicates the normal power-off after power-on of the storage device.

13. The method of claim 12, wherein the normal program operation is performed by a normal write command sent by the memory controller to the nonvolatile memory, and the normal write command includes the user data and an address corresponding to the initial clean page which are generated by the request of a host.

14. A method for programming a storage device, the storage device including a nonvolatile memory device and a memory controller, the nonvolatile memory device including a user data area and a meta area, the user data area including a plurality of memory blocks, each memory block including a plurality of pages, each page being programmed in sequential order, each word line programmed multiple times to store multiple pages, the method comprising:

reading power information stored in the meta area after power-on of the storage device, wherein the power information indicates one of normal power-off and sudden power-off;

searching a boundary page in the memory blocks if the power information indicates the sudden power-off, the boundary page being the last programmed page before the sudden power-off;

performing a dummy program operation on a boundary word line, wherein the boundary word line is a word line including the boundary page; and performing a normal program operation on the initial clean word line, wherein the initial clean word line is a clean word line being a couple of adjacent to the boundary word line.

15. The method of claim 14, wherein the method further includes setting the power information as normal power-off in response to a power-off notification issued from a host before power-off of the storage device.

16. The method of claim 15, wherein the power-off notification is issued by the host when a power is normally turned off.

17. The method of claim 16, wherein the power information maintains the sudden power-off if the power-off notification is not issued.

18. The method of claim 14, wherein the searching a boundary page includes reading the meta area in which information relating to the boundary page is stored.

19. The method of claim 14, wherein the searching a boundary page includes reading the memory blocks for finding the boundary page with binary searching manner.

20. The method of claim 14, wherein the method further includes generating dummy data by the memory controller upon completion of searching the boundary page.

21. The method of claim 20, wherein the dummy data are random data using the address corresponding to the boundary page as a seed value.

22. The method of claim 14, wherein the dummy program operation is performed by a dummy program command sent by the memory controller to the nonvolatile memory, the dummy program command including the dummy data and an address corresponding to the boundary page which are generated regardless of request of a host.

23. The method of claim 14, wherein the normal program operation are performed before the erase of the dummy data.

24. The method of claim 14, wherein the method further includes performing a normal program operation on a clean word line adjacent to a normal data word line if the power information indicates the normal power-off after power-on of the storage device.

25. The method of claim 24, wherein each memory cell of the plurality of memory is a multi-level cell, the multi-level cell selectively storing one of one-bit data, two-bit data, and three-bit data.

26. The method of claim 25, wherein each word line is programmed multiple times depending on the number of data bits to be stored in the multi-level cell.

27. The method of claim 14, wherein the dummy program operation is faster than the normal program operation.

28. The method of claim 27, wherein the dummy program operation is one bit write operation and the normal program operation is multiple bit write operation.

29. The method of claim 14, wherein the method further includes determining a program depth of at least one lower word line physically below the boundary word line, and performing a dummy program operation on the lower word line if the program depth is less than a predetermined desired value.

30. The method of claim 29, wherein the predetermined desired value is set by one of the number of error bits and threshold voltage distribution of the memory cells.

31. A method for programming a storage device, the storage device including a nonvolatile memory device and a memory controller, the nonvolatile memory device including a user data area and a meta area, the user data area including a plurality of memory blocks, each memory block including a plurality of word lines, the plurality of word lines being programmed in sequential order, each word line programmed multiple times to store multiple pages, the method comprising:

reading power information stored in the meta area after power-on of the storage device, wherein the power information indicates one of normal power-off and sudden power-off;

searching a boundary page in the memory blocks if the power information indicates the sudden power-off, the boundary page being the last programmed page before the sudden power-off;

performing a dummy program operation on a boundary word line and at least one of clean word lines adjacent to the boundary word line, wherein the boundary word line is a word line including the boundary page; and performing a normal program operation on a clean word line adjacent to dummy programmed word lines.

* * * * *